United States Patent
Moosburger et al.

(10) Patent No.: US 11,425,828 B2
(45) Date of Patent: Aug. 23, 2022

(54) MULTI-PART UNIVERSAL HOUSING HAVING MOUNTING DEVICE FOR FASTENING THE HOUSING

(71) Applicant: DEHN SE + CO KG, Neumarkt/Opf. (DE)

(72) Inventors: Benjamin Moosburger, Seubersdorf (DE); Ansgar Brossardt, Gilching (DE); Julius Maria Schrafl, Neumarkt (DE); Markus Götz, Deining (DE); Tobias Braun, Mühlhausen (DE); Michael Hess, Neumarkt (DE)

(73) Assignee: DEHN SE + CO KG, Neumarkt/Opf. (DE)

( * ) Notice: Subject to any disclaimer, the term of this patent is extended or adjusted under 35 U.S.C. 154(b) by 103 days.

(21) Appl. No.: 16/626,660

(22) PCT Filed: Mar. 28, 2019

(86) PCT No.: PCT/EP2019/057876
§ 371 (c)(1),
(2) Date: Dec. 26, 2019

(87) PCT Pub. No.: WO2019/192925
PCT Pub. Date: Oct. 10, 2019

(65) Prior Publication Data
US 2021/0014987 A1    Jan. 14, 2021

(30) Foreign Application Priority Data

Apr. 6, 2018  (DE) .......................... 202018101873.6
Jun. 28, 2018  (DE) .......................... 202018103690.4

(51) Int. Cl.
*H05K 5/02*      (2006.01)
*F16M 13/02*    (2006.01)
(Continued)

(52) U.S. Cl.
CPC .......... *H05K 5/0204* (2013.01); *F16M 13/02* (2013.01); *H01Q 1/1228* (2013.01); *H02G 3/32* (2013.01)

(58) Field of Classification Search
None
See application file for complete search history.

(56) References Cited

U.S. PATENT DOCUMENTS 5,098,051 A * 3/1992 Aldridge .................. G09F 7/18
                                                            248/219.4
5,799,916 A * 9/1998 Lechner .................... F16L 1/24
                                                            248/230.8
(Continued)

FOREIGN PATENT DOCUMENTS

DE    9404325 U1    4/1994    ............. F16M 13/02
DE    4340255 A1    6/1995    ............. A47B 95/00
(Continued)

OTHER PUBLICATIONS

An Office Action (in German), dated Aug. 29, 2018, issued by the German Patent Office for Applicant's corresponding German Patent Application No. DE202018103690.4, filed Jun. 28, 2018.
(Continued)

*Primary Examiner* — Xanthia C Cunningham
(74) *Attorney, Agent, or Firm* — Bodner & O'Rourke, LLP; Gerald T. Bodner; Christian P. Bodner

(57) ABSTRACT

The invention relates to a multi-part universal housing for receiving information technology, measurement technology and communication technology components also with an integrated surge protector for applications under a very wide range of climatic conditions and with a high protection level. The housing consists of a main housing body, wherein a removable housing lid is provided on the front side and a mounting device can be attached on the rear side of the main housing body. The mounting device is furthermore designed
(Continued)

Figure 1:
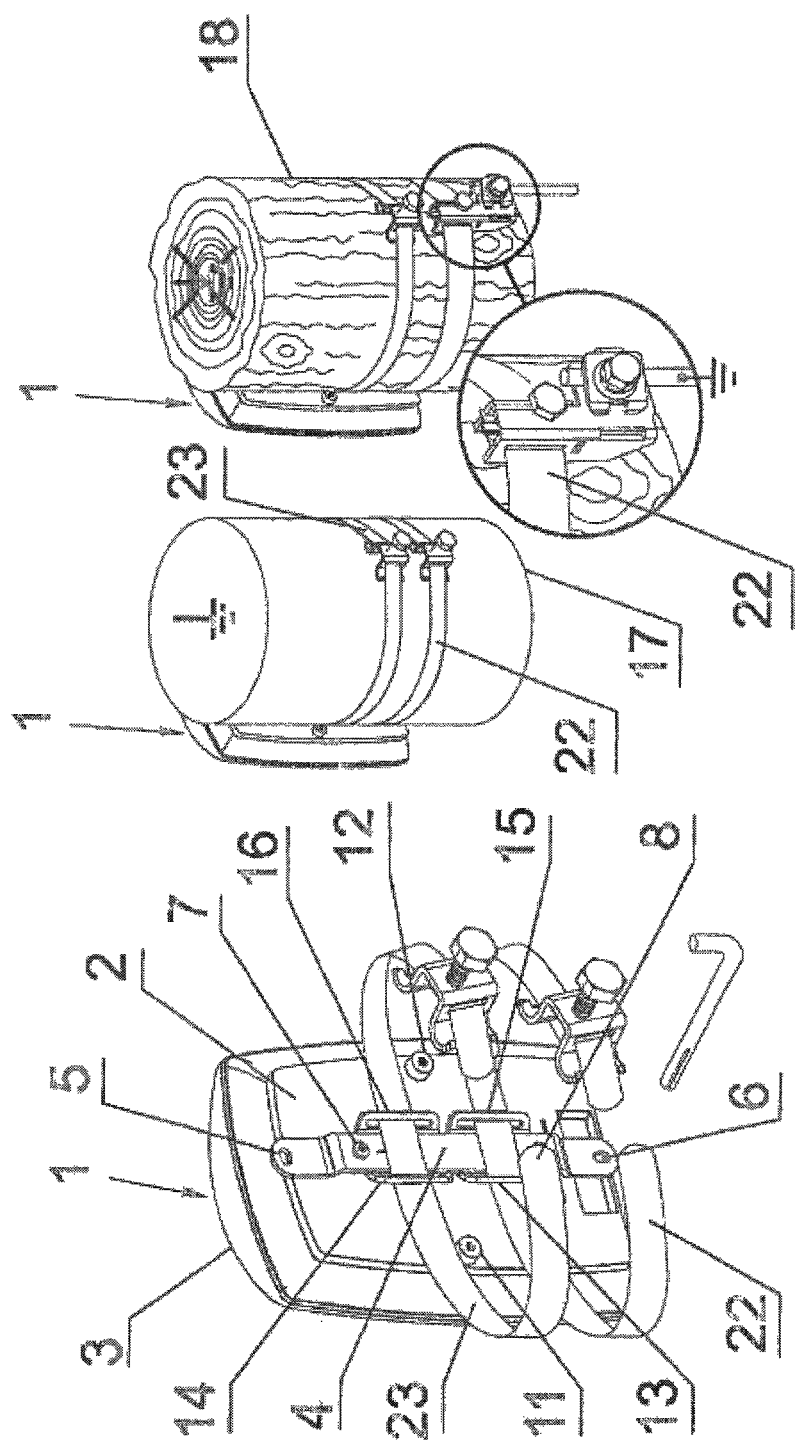

as an elongate bracket having two elbowed portions, wherein each elbowed bracket end has at least one fastening recess, and at least two spaced fastening apertures are provided in the bracket region disposed between the elbowed portions, the distance between said apertures corresponding to fastening domes disposed on the rear side of the main housing body.

11 Claims, 3 Drawing Sheets

(51) Int. Cl.
    *H01Q 1/12*     (2006.01)
    *H02G 3/32*     (2006.01)

(56) References Cited

U.S. PATENT DOCUMENTS

| | | | | |
|---|---|---|---|---|
| 6,086,031 | A * | 7/2000 | Renfro | A01M 31/02 248/230.8 |
| 6,185,303 | B1 * | 2/2001 | Losey | A47B 96/06 379/453 |
| 6,189,488 | B1 * | 2/2001 | Goldsher | A01K 7/00 248/65 |
| 6,229,948 | B1 | 5/2001 | Blee et al. | 385/134 |
| 6,357,709 | B1 * | 3/2002 | Parduhn | F21V 21/116 248/214 |
| 6,486,399 | B1 * | 11/2002 | Armstrong | H05K 5/0204 439/535 |
| 6,508,446 | B1 * | 1/2003 | Addison | A47D 13/105 182/187 |
| 6,581,891 | B1 * | 6/2003 | Byrd | A47B 5/04 248/230.8 |
| 6,588,440 | B2 * | 7/2003 | Varnado | E04H 15/04 248/230.8 |
| 6,766,992 | B1 * | 7/2004 | Parker | F16M 13/022 248/219.3 |
| 6,823,811 | B1 * | 11/2004 | Drake | B63B 59/02 405/212 |
| 6,926,240 | B2 * | 8/2005 | Goeller | F16M 13/022 108/151 |
| 6,974,908 | B2 * | 12/2005 | White | H02G 3/32 174/53 |
| 7,578,488 | B2 * | 8/2009 | Kiser | H02G 7/05 248/219.3 |
| 7,677,503 | B2 * | 3/2010 | Michaud | H02G 3/123 248/300 |
| 7,690,481 | B1 * | 4/2010 | Pederson | A01M 31/02 248/230.8 |
| 7,789,574 | B2 * | 9/2010 | Broberg | F16M 13/02 396/419 |
| 7,810,783 | B2 * | 10/2010 | Tsay | B62D 1/043 248/230.8 |
| 7,883,065 | B2 * | 2/2011 | Nelson | F16M 11/2021 248/70 |
| 8,627,778 | B2 * | 1/2014 | Wright | B63C 1/02 114/45 |
| 9,200,654 | B1 * | 12/2015 | Parduhn | F16B 2/08 |
| 9,228,679 | B2 * | 1/2016 | Koss | F16L 3/137 |
| 9,232,783 | B2 * | 1/2016 | Blackwell | A01M 31/02 |
| 9,472,935 | B1 * | 10/2016 | Gretz | H02G 3/10 |
| 9,657,891 | B1 * | 5/2017 | Tatem | F16M 13/02 |
| 9,695,976 | B2 * | 7/2017 | Hill | E01F 9/65 |
| 9,869,331 | B2 * | 1/2018 | Muntasser | F16B 2/08 |
| 9,966,649 | B2 * | 5/2018 | Christie | H01Q 1/125 |
| 10,103,421 | B1 * | 10/2018 | Alexander | H01Q 3/06 |
| 10,522,059 | B1 * | 12/2019 | Greilanger | G09F 7/18 |
| 10,948,258 | B1 * | 3/2021 | Kitts | F41B 5/1403 |
| 2005/0029419 | A1 * | 2/2005 | Ware | H02G 3/10 248/218.4 |
| 2005/0056744 | A1 * | 3/2005 | Ware | G09F 15/0037 248/230.8 |
| 2008/0239632 | A1 | 10/2008 | Wayman | 361/600 |
| 2008/0245938 | A1 * | 10/2008 | Qualy | F16M 13/02 248/230.9 |
| 2010/0314514 | A1 * | 12/2010 | Nelson | F16M 11/2021 248/218.4 |
| 2013/0071176 | A1 | 3/2013 | Chen et al. | 403/164 |

FOREIGN PATENT DOCUMENTS

| | | | | |
|---|---|---|---|---|
| DE | 9413254 | | 1/1996 | G08B 13/196 |
| DE | 4340255 | C2 | 2/1996 | A47B 95/00 |
| DE | 19920653 | A1 | 11/2000 | H02G 3/18 |
| DE | 202016005313 | U1 | 2/2017 | H01Q 1/12 |
| EP | 1050941 | A1 | 11/2000 | H02G 3/18 |

OTHER PUBLICATIONS

The Written Opinion of the International Searching Authority, in German, dated Jul. 5, 2019, which was issued by the International Bureau of WIPO in Applicant's corresponding international PCT application having Serial No. PCT/EP2019/057876, filed on Mar. 28, 2019.

The International Search Report, in English, dated Jul. 5, 2019, which was issued by the International Bureau of WIPO in Applicant's corresponding international PCT application having Serial No. PCT/EP2019/057876, filed on Mar. 28, 2019.

\* cited by examiner

MULTI-PART UNIVERSAL HOUSING HAVING MOUNTING DEVICE FOR FASTENING THE HOUSING

The invention relates to a multi-part universal housing for receiving information technology, measurement technology and communication technology components also with an integrated surge protector for applications under a very wide range of climatic conditions and with a high protection level, wherein the housing consists of a main housing body, wherein a removable housing lid is provided on the front side and a mounting device can be attached on the rear side of the main housing body according to the preamble of claim 1.

DE 20 2016 005 313 U1 discloses a standardized, modular universal housing with an application-specific front cover and use-related special inserts for receiving various electronic components. The teaching therein also shows a universal connector which permits the various housings to be interconnected for the purpose of cable routing.

Currently, housings of the corresponding protection level are employed for installing and mounting various electronic information technology, measurement technology and communication technology components on poles and building walls.

These housings are designed either for pole mounting or for mounting on a substantially flat surface.

The universal housing of the prior art according to DE 20 2016 005 313 U1 consists of three parts which can be combined according to requirements. In the central main housing, the electronic components are fixed to a separate circuit board with spacers, for example by screws in the housing.

The top and bottom of the housing are each provided with three cut-outs of different sizes which are removed as required to accommodate the technically required built-in connection sockets, such as for power supply or antenna ports. Furthermore, a threaded receptacle is provided for connecting another connector.

To prevent the formation of condensed water and possible overheating inside the housing, several holes are placed on each side of the housing. These holes are provided with a membrane which is designed such that both heat and moisture escape, but moisture cannot enter.

To fasten the housing according to DE 20 2016 005 313 U1, different holders are shown for the various basic elements. In a first embodiment, the universal housing can be fastened vertically by means of hose clamps to any conventional pole using a pole adapter.

In a further embodiment, mounting is possible horizontally using the same fastening technique.

In a third embodiment, a hinge is inserted between the base housing and the mast adapter, offering the possibility of pivoting the universal housing vertically which is advantageous for optical detection systems.

Mounting the individual embodiments of the holders is accomplished by means of screws which are screwed into designated seats on the inside of the main housing after assembling the components, thus creating a tight and permanent connection. The exemplary vertical standard pole holder is mounted on the rear side of the main housing in a planar or upright position by lathing existing recesses in the pole holder with corresponding protruding cams of the main housing and then non-positively joining the parts by means of screws.

In the prior-art universal housing presented above, it is possible to adapt to a given mounting task by using different holders. However, it is necessary to provide a specifically designed holder for each defined application which, on the one hand, increases production costs and, on the other hand, results in additional storage requirements.

In light of the above, an object of the invention is therefore to provide a further developed, multi-part universal housing for receiving information technology, measurement technology and communication technology components also with an integrated surge protector. The universal housing to be provided is to come fully assembled with a mounting device, wherein the mounting device itself enables the universal housing to be installed on vertical or horizontal poles just as easily as it can be mounted on substantially flat surfaces.

The object of the invention is achieved by a multi-part universal housing according to the combination of features according to claim 1, wherein the dependent claims at least represent convenient designs and further developments.

In this regard, a multi-part universal housing for receiving electronic information technology, measurement technology and communication technology components, in particular, is considered. Such electronic components can also include components for surge protection, connection sockets or connection plugs or the like.

The universal housing is usable under a wide range of climatic conditions and has a high protection level of up to IP66.

The housing consists of a main housing body, wherein a removable housing lid is provided on the front side and a mounting device can be attached on the rear side of the main housing body.

According to the invention, the mounting device is designed as an elongate, in particular metallic, bracket having two elbowed portions.

Each elbowed bracket end has at least one fastening recess, for example in the form of an oblong hole.

At least two spaced fastening apertures are provided in the bracket region disposed between the elbowed portions, the distance between said apertures corresponding to fastening domes disposed on the rear side of the main housing body.

In one design of the invention, the fastening domes are implemented as screw domes. In this case, the fastening domes have a threaded hole.

The elongate bracket having two elbowed portions can be mounted on the rear side of the main housing body with its fastening apertures with the aid of suitable screws.

Furthermore, the bracket has at least two tabs between the elbowed portions, which extend in parallel to the longitudinal direction of the bracket and project laterally from the bracket.

The tabs have a bend or angular offset and at least one recess in the shape of an elongate hole or slot. The bend or angular offset of the tabs extends counter to the elbowed ends.

Together with the bracket portion located therebetween, the angular offset of the tabs is implemented such that it is possible, for example, to mount the universal housing to poles in the range of a diameter of 5-50 cm. Thus, to this extent, the surface of the tabs comes into contact with a peripheral portion of a vertically positioned pole, for example.

The bracket is fixable to the fastening domes in at least two different positions at different angles from each other to, one the one hand, accomplish horizontal or vertical pole mounting by using retaining straps or like means threaded through the recesses in the shape of oblong holes or slots if the tabs are in a position protruding from the rear side of the main housing body, or to perform mounting to a wall by means of the fastening recesses if the tabs are in a position facing the rear side of the main housing body.

As set forth previously, in a preferred embodiment, the fastening domes are configured as screw domes and are located on the rear side of the main housing body in a 12-3-6 and 9 o'clock position. In such a position, fixing the bracket is accomplished by using two opposite but not immediately adjacent fastening domes either vertically or horizontally, as an example. Hence, with an unchanged position of the housing, mounting on, for example, a vertical pole or even on a horizontally extending pipe or the like can be achieved.

In a preferred embodiment, the lateral tabs located at the bracket are configured as a plurality and in pairs such that a corresponding pair of retaining straps or cable ties can be used for mounting the universal housing to a pole and for secure fastening.

In a preferably approximately or substantially rectangular housing, the clear length dimensions of the bracket are chosen to be larger than the smallest side of the housing, but smaller than the largest side of the rectangle of the housing, wherein, for mounting to a wall, the bracket ends extend laterally with fastening recesses with respect to the housing to, for example, be able to freely perform the desired fastening by means of a screw connection.

In a preferred embodiment, the bracket is inexpensive to produce as a stamped and bent part.

Furthermore, recesses are provided on the main housing body for receiving at least one cable feed with strain relief. These recesses each receive a resilient molded part having one or more bushings for one or more cables. The resilience of this molded part ensures the required sealing after mounting the housing lid and exerting a corresponding force via an edge provided on the lid. The edge provided on the lid, which exerts compressive forces with respect to the molded body, may have a conical shape, on the one hand, to compensate for tolerances and, on the other hand, to produce sufficient sealing force when receiving cables of different diameters.

The housing lid and the main housing body can be connected to each other in a known manner by means of a screw connection or also by clamping or bracing.

In one embodiment of the invention, at least one diaphragm valve is inserted into the rear side of the housing to compensate for climatic fluctuations, wherein the diaphragm valve is protected from immediate exposure to moisture by the bracket extending above it at a distance. Such a measure serves to achieve the necessary protection level.

In one design of the invention, the bracket or the housing has a label with an earthing symbol in the region of a connectable earth connection. This earthing symbol can be embossed or punched during production of the bracket.

In one design of the invention, the housing can have multiple portions or chambers of different protection levels.

In a preferred embodiment of the invention, the housing consists of a conductive material, in particular a die-cast material, here even more particularly an aluminum die-cast material.

In a further development of the invention, a peripheral seal is formed between the main housing body and the housing lid, wherein the housing lid has a projection, which may be formed like a roof, to protect the seal from harmful environmental influences, in particular against UV radiation.

In the following, the invention will be explained with reference to an exemplary embodiment and with the aid of figures.

Figure 2:
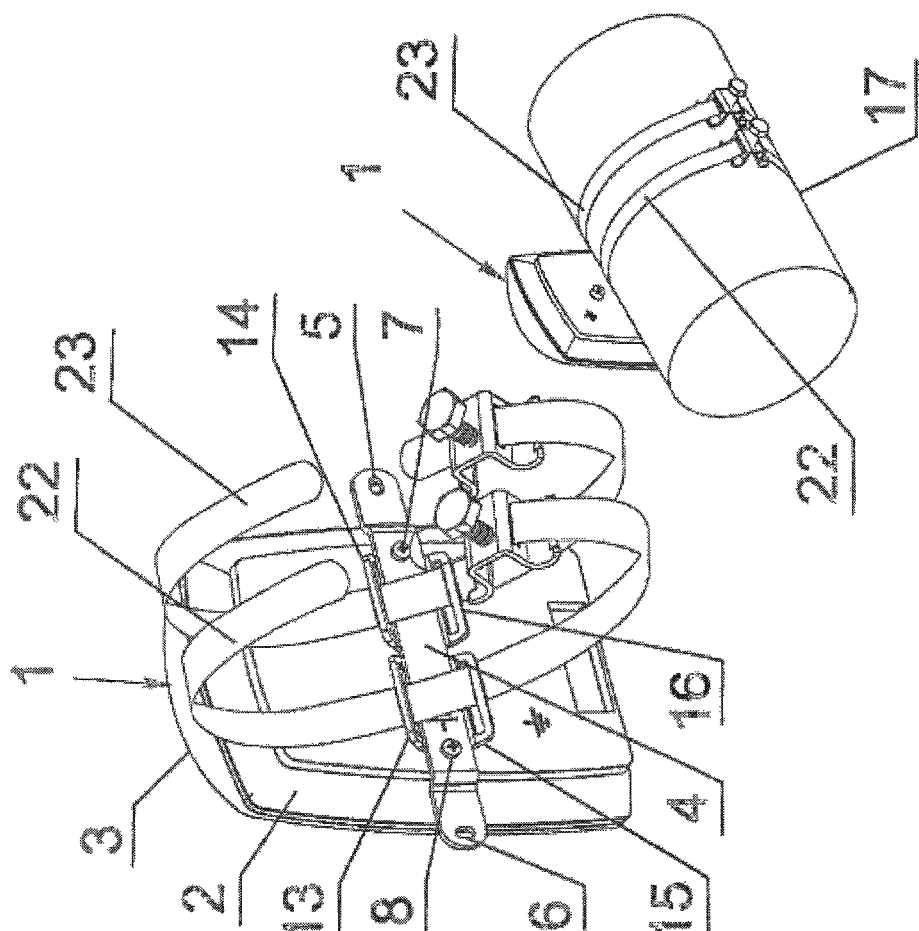
Figure 3:
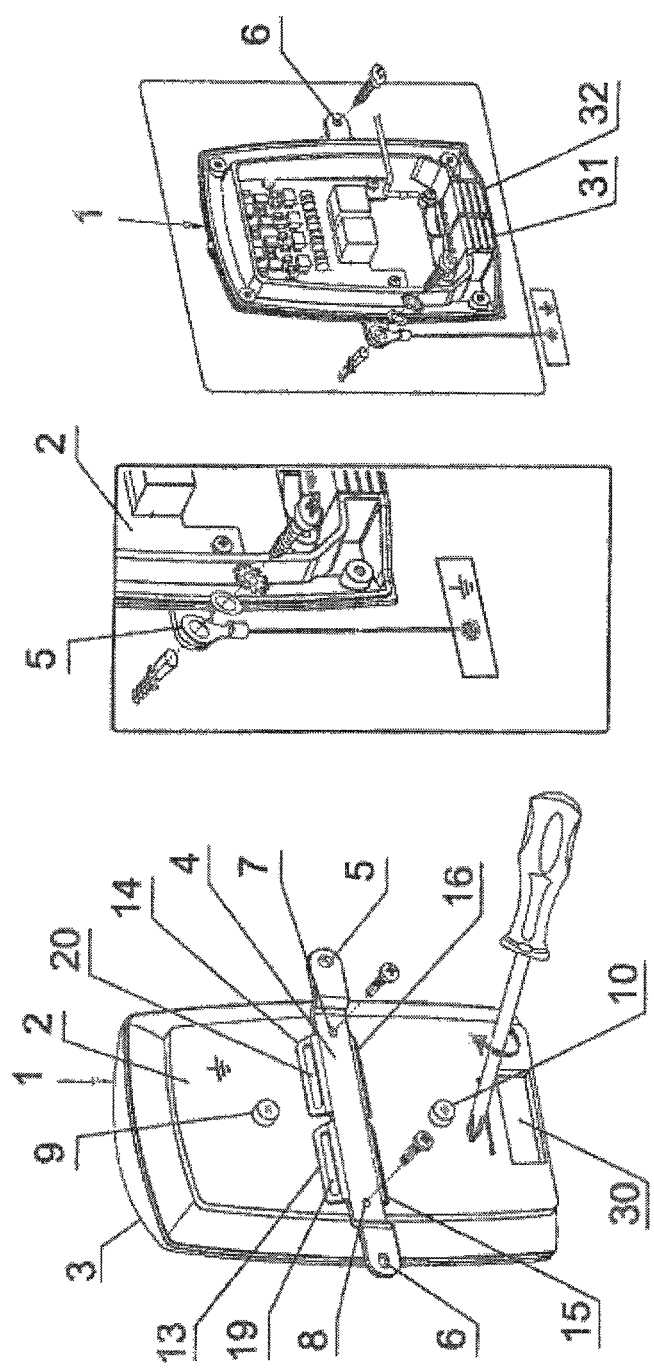

In the figures,

FIG. 1 shows a schematic illustration of mounting the universal housing to a vertical pole which may be configured to be both conductive and non-conductive;

FIG. 2 shows an illustration similar to that of FIG. 1, but with a bracket for horizontal pole mounting, the position of which is modified by 90° and which is fasted to the rear side of the housing; and FIG. 3 shows a design of the universal housing having a bracket as the mounting device, wherein the bracket is fasted to the main housing body by its laterally extending, angled tabs such that the tabs face towards the main body, creating a largely flat bracket rear side for corresponding installation on a wall or the like.

The illustrations according to FIG. 1 initially assume a desired pole mounting of the universal housing.

Housing 1 has a main housing body 2 provided with a removable housing lid 3.

A mounting device is attached to the rear side of the main housing body.

This mounting device is configured as a bracket 4. The bracket itself has two elbowed portions and is elongate.

Each elbowed bracket end has at least one fastening recess 5; 6.

In the bracket region lying between the elbowed portions, at least two spaced fastening apertures 7; 8 are provided.

In the illustrations of FIGS. 1 and 2, fastening screws are already inserted into these fastening apertures 7 and 8 for fixing bracket 4 to fastening domes 9; 10; 11; 12 disposed on the rear side of main housing body 2.

Between the elbowed portions of bracket 4, at least two tabs 13; 14 and 15; 16 extend in parallel to the longitudinal dimension of the bracket and protrude laterally from the bracket. In the illustrations of FIGS. 1 to 3, it can be seen that tabs 13, 14, 15 and 16 have a bend or angular offset.

The bend or angular offset is adapted such (see FIGS. 1 and 2) that they contact the surface of a metal 17 or non-metal pole 18 circumferentially or tangentially.

The tabs each have at least one slot-shaped recess 19; 20.

These slot-shaped recesses 19; 20 allow for the possibility to thread in hose clamps 22 or 23 by means of which vertical (FIG. 1) or horizontal (FIG. 2) mounting is then possible.

The bend or angular offset of tabs 13, 14, 15, 16 extends counter to the elbowed bracket ends. The height of domes 9; 10 or 11; 12 corresponds to at least the degree of set-back of the elbowed portions of bracket 4 and is adapted to the degree of the resulting protrusion of the tabs taking into account the bend or angular offset, so that, as shown in FIG. 3, when mounting the bracket with the tabs towards the rear side of main housing body 2, a secure screw connection of bracket 4 to the fastening domes shown therein can be achieved without the outer ends of the tabs possibly exerting unnecessary forces on the rear surface of the main housing body.

As shown in FIGS. 1 and 2, bracket 4 is fixable to the corresponding fastening domes in at least two different positions which are at different angles to one another.

FIGS. 1 and 2 have in common that the fastening of the bracket is achieved such that the tabs protrude from the rear side of the main housing body to enable vertical (FIG. 1) or horizontal pole mounting (FIG. 2) as shown.

When mounting the bracket while rotated around its own longitudinal axis according to FIG. 3, the positions of the tabs face towards the rear side of the main housing body. The fastening recesses, which laterally project relative to the width of the housing by the dimensions of bracket 4, are freely accessible to perform mounting to a wall by means of screws, while an earthing connection is connectable at the same time, as shown in FIG. 3 and the detailed illustrations therein.

As can be seen in the figures, fastening domes 7, 8 or 9, 10 are formed as screw domes which, as an example, are located in a 12-3-6-9 o'clock position on the rear side of main housing body 2.

Tabs 13; 14 or 15; 16 of the bracket are able to be implemented in pairs to receive a corresponding pair of cable clamps 22; 23, resulting in the secure fastening desired.

From the exemplary figures, it can be seen that in the case of a substantially rectangular housing 1, the clear length dimensions of bracket 4 are chosen to be larger than the smallest side, but smaller than the largest side of the rectangle of the housing, wherein the bracket ends project from the housing with their fastening recesses 6; 5 for mounting to a wall.

Bracket 4 shown in the figures can preferably be implemented as a stamped and bent part.

Recesses 30 for receiving at least one cable feed with strain relief are provided on main housing body 2.

The cable feed with strain relief consists of molded parts 31; 32 which can be inserted into recess 30 and are covered and surrounded by lid 3 on the front side.

Between main housing body 2 and housing lid 3, a peripheral seal can be inserted into a corresponding groove, housing lid 3 having a protrusion to protect the seal from harmful environmental influences, in particular from UV radiation.

A diaphragm valve not shown in the figures is located on the rear side of the housing and is covered by bracket 4 extending thereabove and thus protected from direct exposure to moisture. However, this cover is provided at an interval so that the desired pressure and temperature compensation can take place freely.

Main housing body 2 can be provided with a label in the form of an earthing symbol in the region of a connectable earth connection (see detailed illustration in FIG. 3).

In a preferred embodiment of the invention, the housing consists of an aluminum die-cast material which, on the one hand, results in electrical shielding and, on the other hand, high mechanical stability.

In a practical embodiment, the housing meets the IP66 protection level and can be used under the toughest strains of climatic fluctuations from −40° C. to +80° C. without affecting the parts or components located in the housing.

The invention claimed is:

1. A multi-part universal housing (1) for receiving information technology, measurement technology and communication technology components also with an integrated surge protector for applications under a very wide range of climatic conditions and with a high protection level, wherein the housing (1) consists of a main housing body (2), wherein a removable housing lid (3) is provided on the front side and a mounting device can be attached on the rear side of the main housing body (2),
characterized in that
the mounting device is designed as an elongate bracket (4) having two elbowed portions, wherein each elbowed bracket end has at least one fastening recess (5; 6), and at least two spaced fastening apertures (7; 8) are provided in the bracket region disposed between the elbowed portions, the distance between said apertures corresponding to fastening domes (9; 10; 11; 12) disposed on the rear side of the main housing body (2), furthermore, the bracket (4) has, between the elbowed portions, at least two tabs (13; 14; 15; 16) extending in parallel to the longitudinal dimension of the bracket (4) and protruding laterally from the bracket (4), wherein the tabs (13; 14; 15; 16) have a bend or angular offset and at least one recess (19; 20) in the form of an oblong hole or slot, and the bend or angular offset extend counter to the elbowed bracket ends,
the bracket (4) is fixable to the fastening domes (9; 10; 11; 12) in at least two different positions at different angles to each other to, one the one hand, accomplish horizontal or vertical pole mounting by using retaining straps (22; 23) or like means threaded through the recess (19; 20) in the shape of an oblong hole or slot if the tabs (13; 14; 15; 16) are in a position protruding from the rear side of the main housing body (2), or to perform mounting to a wall by means of the fastening recesses (5; 6) if the tabs (13; 14; 15; 16) are in a position facing the rear side of the main housing body (2).

2. The multi-part universal housing according to claim 1, characterized in that
the fastening domes (9; 10; 11; 12) are designed as screw domes and are located on the rear side of the main housing body (2) in a 12-3-6 and 9 o'clock position.

3. The multi-part universal housing according to claim 1 or 2,
characterized in that
the tabs (13; 14; 15; 16) are configured as a plurality and in pairs.

4. The multi-part universal housing according to claim 1, characterized in that
with a substantially rectangular housing (1), the clear length dimensions of the bracket (4) are chosen to be larger than the smallest side, but smaller than the largest side of the rectangle of the housing, wherein, for mounting to a wall, the bracket ends protrude from the housing with fastening recesses (5; 6).

5. The multi-part universal housing according to claim 1, characterized in that
the bracket (4) is a stamped and bent part.

6. The multi-part universal housing according to claim 1, characterized in that
recesses (30) are provided on the main housing body (2) for receiving at least one cable feed with strain relief (31; 32).

7. The multi-part universal housing according to claim 1, characterized in that
between the main housing body (2) and the housing lid (3), a peripheral seal is formed, the housing lid (3) having a protrusion to protect the seal from harmful environmental influences.

8. The multi-part universal housing according to claim 1, characterized in that
a diaphragm valve is insertable into the rear housing side of the main housing body (2) to compensate for climatic fluctuations, wherein the diaphragm valve is protected from direct exposure to moisture by the bracket (4) extending thereabove.

9. The multi-part universal housing according to claim 1, characterized in that
the main housing body (2) has a label with an earthing symbol in the region of a connectable earth connection.

10. The multi-part universal housing according to claim 1, characterized in that
the housing (1) possesses multiple portions or chambers of different protection levels.

11. The multi-part universal housing according to claim 1, characterized in that
the housing (1) consists of a conductive material, in particular a die-cast material, here even more particularly an aluminum die-cast material.

* * * * *